United States Patent [19]

Collins et al.

[11] 4,410,307

[45] Oct. 18, 1983

[54] CONDUCTIVE INK FOR FLASH LAMP ARRAY CIRCUIT

[75] Inventors: Edward J. Collins, Mentor-on-the-Lake; Mary E. Suster, Chagrin Falls, both of Ohio

[73] Assignee: General Electric Company, Schenectady, N.Y.

[21] Appl. No.: 205,413

[22] Filed: Nov. 10, 1980

[51] Int. Cl.³ .................... F21K 5/00; G03B 15/02; H01B 1/06

[52] U.S. Cl. .................... 431/359; 362/13; 252/510

[58] Field of Search .............. 431/359; 362/13, 4, 362/6, 15; 252/503, 510, 511

[56] References Cited

U.S. PATENT DOCUMENTS 3,003,975 10/1961 Louis .................... 252/503
4,290,747 9/1981 Collins .................... 362/13

Primary Examiner—Samuel Scott
Assistant Examiner—G. Anderson
Attorney, Agent, or Firm—John F. McDevitt; Philip L. Schlamp; Fred Jacob

[57] ABSTRACT

A modified conductive ink is provided for a photoflash array having a plurality of high voltage flash lamps connected to a lamp firing circuit pattern deposited on a circuit board with radiation-sensitive switches and fuse elements being connected in said circuit pattern for sequential firing of said flash lamps, said fuse elements being provided by narrowing the width of the circuit pattern at the fuse locations and undergoing thermal decomposition activated with radiation, wherein the improvement comprises a modified carbon ink containing a particulated electrically conductive material such as conductive powdered carbon incorporated therein. Increased electrical conductivity is provided at the fuse locations before thermal decomposition of the fuse elements takes place together with increased residual electrical resistance being provided by the thermally decomposed fused elements.

6 Claims, 3 Drawing Figures

CONDUCTIVE INK FOR FLASH LAMP ARRAY CIRCUIT

CROSS REFERENCE TO RELATED APPLICATIONS

In U.S. patent application Ser. No. 205,412, filed concurrently herewith in the name of M. E. Suster, there is described and claimed a modified conductive carbon ink for a flash lamp array circuit containing a particulated electrically conductive material such as graphite or metal flakes, metal coated glass spheres, and the like. Increased electrical conductivity is obtained in this manner which improves flashability and electrostatic flash out protection for the associated flash lamps. The preferred embodiments further include use of the same modified conductive ink to serve as integral fuse elements in the circuit pattern by narrowing the width of said circuit pattern at the fuse locations and said preferred embodiments can further locate both radiation switches and fuse elements adjacent to the flash lamps for simultaneous actuation when the adjoining flash lamp is flashed. The present application represents a still further improvement in the modified carbon ink composition with respect to operation of the fuse elements in this type flash lamp array circuit.

BACKGROUND OF THE INVENTION

Addition of a particulated electrically conductive material such as graphite or metal flakes, metal coated glass spheres, and the like to a conductive carbon ink as disclosed in the cross-referenced patent application filed concurrently herewith provides a desirable increase in electrical conductivity to improve the operational reliability of a flash lamp array circuit pattern using this type ink. More particularly, such additives reduce the incidence of lamp failures to flash by a considerable degree while further enabling the modified inks to serve as integral fuse elements in the circuit pattern. On the other hand, there still exists a need to further improve the reliability of fuse operation beyond that already obtained since increasingly lower intensity flash lamps are now being used which creates a greater likelihood of a short circuit condition being experienced. It is a primary object of the present invention, therefore, to provide a modified carbon ink demonstrating still greater operational reliability when used as integral fuse elements in the circuit pattern. Another important object is to provide a modified carbon ink exhibiting improved electrical resistance and dielectric breakdown voltage characteristics after thermal decomposition when serving as the fuse means in a flash lamp array circuit. Such operative characteristics for the fuse means in this type circuit helps prevent application of a successive high voltage firing pulse to an already flashed lamp.

SUMMARY OF THE INVENTION

The foregoing objectives along with still other important benefits are achieved in accordance with the present invention by modification of available carbon inks containing at least 25% by weight of powdered carbon in the dry solid coating to further include a particulated electrically conductive radiation-absorbing material. More particularly, the presently modified conductive ink is a mixture containing at least 25% in the dry solid coating of powdered carbon and an organic polymer binder with a particulated electrically conductive radiation-absorbing material imparting increased electrical conductivity before thermal decomposition together with increased residual electrical resistance after being thermally decomposed. More particularly, the presently improved photoflash array employs a plurality of high voltage type flash lamps connected to a lamp firing circuit pattern deposited on a circuit board with radiation-sensitive switches and fuse elements being connected to said circuit pattern for sequential firing of said flash lamps, said fuse elements being provided by narrowing the width of the circuit pattern at the fuse locations and undergoing thermal decomposition when activated with radiation, and wherein said improvement comprises a conductive ink for said circuit pattern and fuse elements which is a mixture containing at least 25% by weight in the dry solid coating of powdered carbon with a particulated electrically conductive radiation-absorbing material and an organic polymer binder, said conductive ink exhibiting increased electrical conductivity at said fuse locations before the thermal decomposition together with increased residual electrical resistance after thermal decomposition. In one preferred embodiment, the radiation switches and fuse elements are located adjacent said flash lamps for simultaneous activation of an adjoining switching fuse element. A different preferred embodiment electrically connects the flash lamps in branch circuits having a radiation switch connected between one side of each pair of successively connected flash lamps and a radiation-sensitive fuse element connected between the remaining side of each pair of successively connected flash lamps, and wherein said fuse elements are further electrically connected together in a series circuit combination to increase the dielectric breakdown voltage of said combination upon successive actuation of the fuse elements.

Suitable conductive inks providing improved operation as above generally indicated can be prepared by proper modification of available commercial carbon inks. One commercially available ink suitable for modification in accordance with the present invention is a product sold by the Advance Process Supply Company under the trade name designation "EL-796" which is reported to contain percentages by weight 22.2% lamp black, 20% organic polymer mixture, with the remainder being various organic liquid vehicles. Customary removal of the liquid vehicles from said ink composition as well as other commercial carbon inks produces a dry solid coating containing at least 25% by weight of the powdered carbon having a considerably higher electrical resistance (generally 30 or 40 times or more) than previously employed silver-containing conductive inks. Suitable particulated electrically conductive radiation-absorbing materials for addition to said commercial carbon inks are finely divided conductive solids exhibiting a bulk resistivity characteristic less than approximately 200 ohm-centimeters and which can be wetted by the various organic liquid vehicles employed in said commercial carbon inks by conventional milling in order to increase the electrical conductivity of the dry solid coating. Moreover, the present additives further impart increased radiation absorption of light/heat to the dry solid coating which does not occur with the particulated electrical conductive additives disclosed in the aforementioned concurrently filed application possibly by reason of optical reflection and larger particle size of said former additives.

DESCRIPTION OF THE PREFERRED EMBODIMENTS

Figure 1:
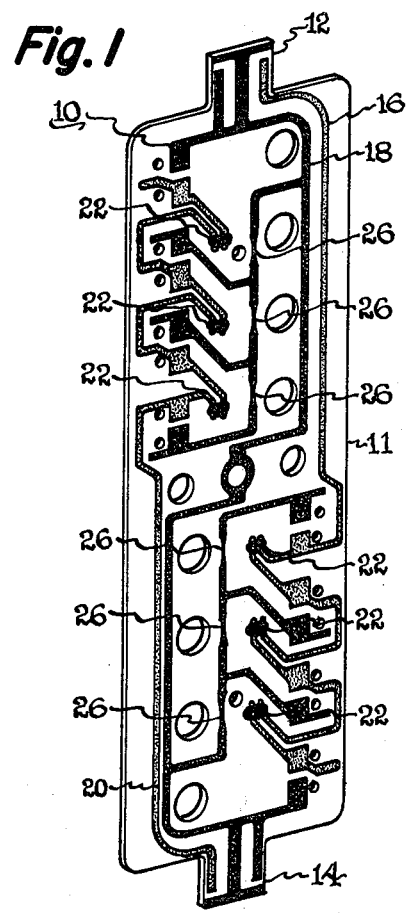
FIG. 1 is a perspective view of a flash array circuit board in accordance with a preferred embodiment of the invention.

In the preferred circuit board embodiment depicted in FIG. 1, both radiation-sensitive switches and radiation-sensitive fuse elements are deposited as part of the circuit pattern on the circuit board adjacent the flash lamp locations for simultaneous actuation of each adjoining switch and fuse element by radiation being emitted from an adjacent flash lamp. Accordingly, a lamp firing circuit pattern 10 is shown having been deposited on a circuit board member 11 preferably in the form of a thermoplastic organic polymer material and with said circuit pattern being formed with the modified ink composition according to the present invention to further include integral fuse elements of the same modified conductive ink. The circuit board member 11 also includes connector tabs 12 and 14 located at each end for insertion of said circuit board member into an associated camera socket (not shown). The camera socket contacts for conductor line 16, 18 and 20, of the lamp firing circuit pattern to connect four flash lamps in parallel between conductive lines 16 and 18 when connector tab 12 has been inserted in the camera socket. Correspondingly, the second group of four lamps is connected between conductor lines 18 and 20 when connector tab 14 has been inserted in the camera socket. While an entire illustrated circuit board is shown, there is need to discuss only a single group of four flash lamps since the operation of the second group of four flash lamps is essentially the mirror image of the first lamp group. Conductor line 16 includes a serially connected arrangement of radiation switches 22 to prevent flash lamps in said group from all being fired together upon release of the camera shutter. As can be noted, the switches 22 are each arranged in the region of the flash lamp termination 24 so that heat and light released when the flash lamp is fired operates to convert the respective switch from a non-conductive to an electrically-conductive state, thus establishing a current path in the next lamp to be flashed. Accordingly, when the particular flash lamp in the circuit is to be flashed, then the adjacent radiation switch is actuated providing a current path to the next lamp to be flashed. Each of the radiation switches is serially connected between the branch circuits connecting lamps in a parallel circuit arrangement to be more fully described. Each of said radiation switches employ a material exhibiting an open circuit or high resistance condition and with said resistance thereafter becoming zero or a low value when said material absorbs radiation and/or heat from the adjoining flash lamp. Individual fuse elements 26 are serially connected together in conductive line 18 as well as being located adjacent to the flash lamp terminations 24 so as also to be actuated by the heat and light released when the adjacent flash lamp is flashed. As can be noted, each of said integral fuse elements simply comprises a more narrow width of the circuit pattern at the fuse location than the remaining width of said circuit pattern elsewhere. When the particular flash lamps adjacent to a given fuse element is flashed, the radiation and/or heat created thereby is absorbed by the circuit pattern at the fuse locations whereupon the more narrow fuse element portions of said circuit pattern become sufficiently thermally decomposed to disrupt the electrical connection to the already fired flash lamp.

Figure 2:
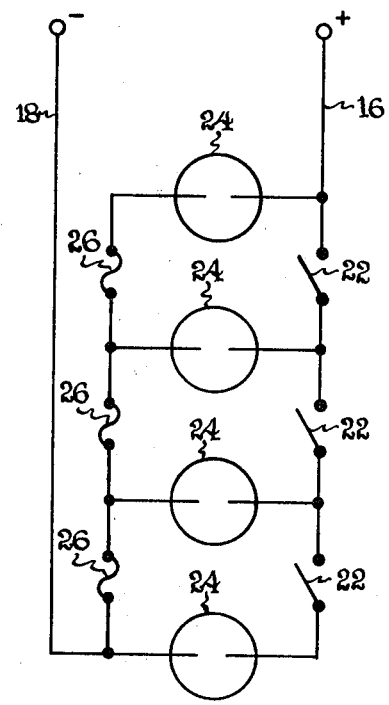
FIG. 2 is an electrical schematic diagram illustrating the circuit path for one group of four flash lamps being sequentially fired by the circuit board configuration in FIG. 1.

A more detailed description of the sequential firing operation for the circuitry of the four-lamp group in the above described circuit board configuration is provided in connection with the schematic drawing shown in FIG. 2. Accordingly, in FIG. 2 there is shown a plurality of flash lamps 24 electrically connected in branch circuits to assure the branch circuit of each lamp will become an open circuit upon flashing of the lamp in that circuit. The desired mode of operation is carried out starting with the topmost circuit when the lamp in said circuit is flashed and causes fuse element 26 in the same branch circuit to physically interrupt the circuit path to said lamp while simultaneously closing the circuit path and flash lamp in the adjacent branch circuit by actuating the radiation-sensitive switch 22 which is serially connected between branch circuits to the conductive state. This cooperative action is repeated between successive branch circuits until all four lamps in the group have been fired from simultaneous actuation of adjoining switching fuse elements with radiation being emitted from an adjacent flash lamp. By further serially connecting all fuse elements 26 between said branch circuits, the likelihood of developing a short circuit condition with an already flashed lamp is understandably reduced. Thus, when the firing pulse is applied to the last branch circuit in a sequence, it becomes necessary to overcome the dielectric breakdown voltage in the previously opened fuse elements for short circuiting of the already flashed lamps. The likelihood of developing a short circuit condition in the topmost already flashed lamp would be theoretically least in the present circuit configuration by reason of being electrically isolated by all three opened fuse elements.

To demonstrate the improved operational reliability attributable to the presently modified conductive ink, a comparative test evaluation was carried out using the same type firing circuit configuration above described. Electrical resistivity measurements were first made at the tab areas of circuit board members prepared with the EL-796 unmodified ink above disclosed for comparison with said ink when modified with approximately 15% by weight graphite flakes as disclosed in the aforementioned concurrently filed application as well as with the modification of said commercial ink in accordance with the present invention which contained approximately 5% by weight added conductive carbon. Said resistivity measurements provide a 15.1 ohms per square per mil thickness for the unmodified carbon ink, 5.0 ohms per square per mil thickness for the 15% graphite flake addition, and 11.5 ohms per square per mil thickness for the presently modified ink. Customary dielectric breakdown voltage measurements were also conducted upon each circuit board member after the fuse elements had been actuated to provide an open circuit path by thermal decomposition. When tested with a 2150 volts piezoelectric pulse source, the converted fuse elements of the unmodified commercial ink exhibited an average 2089 volts breakdown whereas a comparative 1792 volts breakdown was exhibited for the converted fuse elements containing 15% graphite flakes while the converted fuse elements using the presently modified ink withstood the entire applied voltage. It will be apparent from all of the foregoing measurements that while the presently modified conductive ink exhibits increased electrical conductivity at the fuse locations before thermal decomposition as compared with the unmodified ink material, there is also obtained increased residual electrical resistance and dielectric standoff capability after thermal decomposition which is superior to that obtained with the previously modified ink material.

Figure 3:
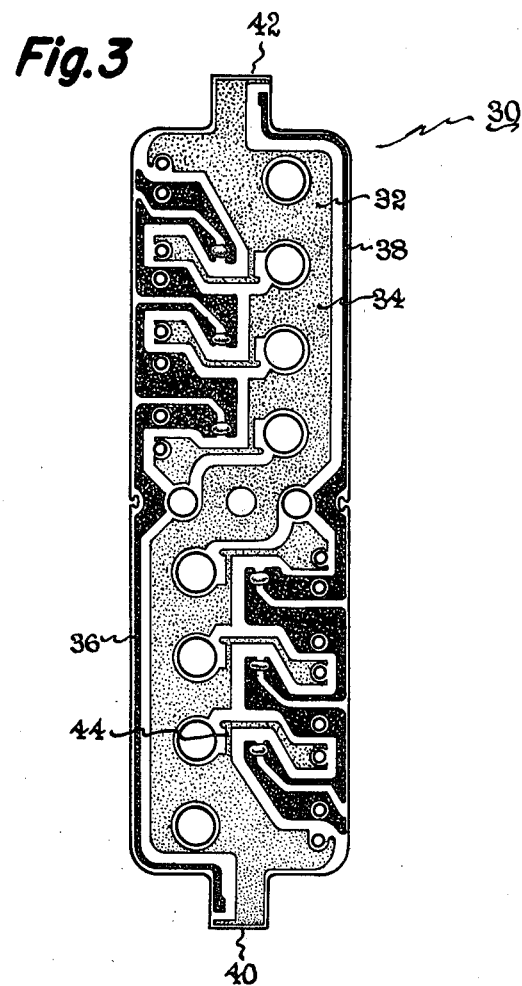
FIG. 3 is a perspective view of the different flash array circuit board in accordance with another preferred embodiment of this invention.

In FIG. 3 there is shown a circuit board member 30 of the same general configuration already described employing a circuit board pattern 32 of the conductive carbon ink which is made wider in a particular manner to provide greater protection of these flash lamps from accidental electrostatic flash out. More particularly, a common electrical grounding circuit 34 extends from one tab of the circuit board member to the other tab and is made wider than each of the conductive runs 36 and 38 which apply to firing pulses sequentially when the flash lamps are connected thereto. As can be further noted, the carbon ink material now occupies most of the connector tab areas 40 and 42 which decreases electrical resistance so that an electrostatic charge applied to these terminals will more readily be carried to further operatively associated electrical grounding means (not shown) instead of reaching the lamps to cause accidental flashing. The wider common circuit run 34 also performs an additional advantageous function acting as a supplemental electrostatic shield behind the flash lamps which further reduces the likelihood of accidental flashing of these lamps. Parallel connected fuse elements 44 are provided in the circuit pattern and thermally decompose in the same manner already above described to prevent electrical shorting by a lamp which has already been flashed. To further demonstrate the improved operational reliability attributable to the presently modified conductive ink, another comparative test evaluation was carried out using the above described firing circuit configuration. The test evaluation compared the incidence of lamp failures to flash in the four-lamp group using the above specified unmodified carbon ink as compared with modifications to said commercial conductive ink further containing either approximately 15 weight percent graphite flakes or 5% conductive carbon based on the weight of the dry solid coating. In carrying out said test evaluation, actual short circuiting of each already flashed lamp in the four-lamp group was employed to create a more severe operational test of the fuse elements in a circuit pattern. Accordingly, the testing of 60 lamp groups under said conditions for each of the conductive inks being compared resulted in 0.8% of the lamps not flashing with the unmodified carbon ink while 4.6 of the lamps did not flash with the 15% graphite flakes modification and all lamps flashed for the present conductive ink. It will be apparent from the said foregoing test evaluations that the presently modified carbon ink provides still greater operational reliability in the circuit pattern.

While preferred embodiments of the invention have been shown and described, various other embodiments and modifications thereto will become apparent to the person skilled in the art. It is thereby intended to limit the present invention only by the scope of the following claims.

What we claim as new and desire to secure by Letters Patent of the United States is:

1. An improved photoflash array having a plurality of high voltage type flash lamps connected to a lamp firing circuit pattern deposited on a circuit board with radiation-sensitive switches and fuse elements being connected in said circuit pattern for sequential firing of said flash lamps, said fuse elements being provided by narrowing the width of the circuit pattern at the fuse locations and undergoing thermal decomposition when activated with radiation, wherein the improvement comprises a non-metallic conductive ink for said circuit pattern and fuse elements which is a mixture containing a least 25% by weight in said mixture of powdered carbon with a particulated electrically conductive radiation-absorbing material selected from graphite and conductive carbon exhibiting a bulk resistivity characteristic less than approximately 200 ohm-centimeters and an organic polymer binder, said conductive ink exhibiting increased electrical conductivity at said fuse locations before thermal decomposition together with increased residual electrical resistance after thermal decomposition.

2. A photoflash array as in claim 1 wherein the radiation switches and fuse elements are located adjacent said flash lamps for simultaneous activation of an adjoining switch and fuse element.

3. A photoflash array as in claim 1 wherein the particulated electrically conductive radiation-absorbing material is conductive carbon.

4. A photoflash array as in claim 2 wherein the flash lamps are electrically connected in branch circuits having a radiation-sensitive switch connected between one side of each pair of successively connected flash lamps and a radiation-sensitive fuse element connected between the remaining side of each pair of successively connected flash lamps.

5. A photoflash array as in claim 4 wherein said fuse elements are electrically connected together in a series circuit combination to increase the dielectric breakdown voltage of said combination upon successive actuation of the fuse elements.

6. A photoflash array as in claim 5 wherein a radiation switch is electrically connected between one side of each pair of successively connected flash lamps and a radiation-sensitive fuse element is connected between the remaining side of each pair of successively connected flash lamps.

* * * * *